(12) United States Patent
Foss et al.

(10) Patent No.: US 7,350,137 B2
(45) Date of Patent: Mar. 25, 2008

(54) METHOD AND CIRCUIT FOR ERROR CORRECTION IN CAM CELLS

(75) Inventors: Richard Foss, Calabogie (CA); Alan Roth, Austin, TX (US)

(73) Assignee: Mosaid Technologies Incorporated, Kanata, ON (CA)

( * ) Notice: Subject to any disclaimer, the term of this patent is extended or adjusted under 35 U.S.C. 154(b) by 2 days.

(21) Appl. No.: 11/313,661

(22) Filed: Dec. 22, 2005

(65) Prior Publication Data
US 2006/0123327 A1 Jun. 8, 2006

Related U.S. Application Data

(63) Continuation of application No. 10/306,732, filed on Nov. 29, 2002, now Pat. No. 7,010,741.

(60) Provisional application No. 60/421,798, filed on Oct. 29, 2002.

(51) Int. Cl.
*G11C 29/00* (2006.01)
(52) U.S. Cl. .................................... 714/805
(58) Field of Classification Search ................ 714/799, 714/800, 801, 802, 804, 805, 758, 764
See application file for complete search history.

(56) References Cited

U.S. PATENT DOCUMENTS

| 4,183,463 A | 1/1980 | Kemmetmueller |
| 4,456,980 A | 6/1984 | Yamada et al. |
| 4,679,196 A * | 7/1987 | Tsujimoto .................. 714/804 |
| 4,688,219 A | 8/1987 | Takemae |
| 4,747,080 A | 5/1988 | Yamada |
| 4,768,193 A | 8/1988 | Takemae |
| 5,127,014 A | 6/1992 | Raynham |
| 5,134,616 A | 7/1992 | Barth, Jr. et al. |
| 6,125,466 A | 9/2000 | Close et al. |
| 6,353,910 B1 | 3/2002 | Carnevale et al. |
| 6,978,343 B1 * | 12/2005 | Ichiriu ........................ 711/108 |

OTHER PUBLICATIONS

Pinaki Mazumder, "An On-Chip ECC Circuit for Correcting Soft Errors in DRAM's with Trench Capacitors", IEEE JSSC, vol. 27, No. 11, Nov. 1992.

* cited by examiner

Primary Examiner—James C. Kerveros
(74) Attorney, Agent, or Firm—Dowell & Dowell P.C.

(57) ABSTRACT

A method and circuit is provided for detecting and correcting errors in an array of content addressable memory (CAM) cells. The array includes wordlines, searchlines, bitlines, and matchlines for reading from, writing to, and searching CAM cells in the array. The method includes the following steps: a row parity bit corresponding to a parity of a first plurality of bits stored along a row of CAM cells is stored; a column parity bit corresponding to the parity of a second plurality of bits stored along a column of CAM cells is stored; a parity of the first plurality of bits is read and generated and the generated parity is compared to the stored row parity bit, if the generated and stored parity bits do not match, columns of the array are cycled through; a parity of the second plurality of bits is read and generated and the generated parity is compared to the stored column parity bit until a mismatch is indicated; and, a bit located at an intersection of the mismatched row and column is inverted if the mismatch is indicated.

22 Claims, 8 Drawing Sheets

METHOD AND CIRCUIT FOR ERROR CORRECTION IN CAM CELLS

CROSS-REFERENCE TO RELATED APPLICATION

This application is a continuation of U.S. patent application Ser. No. 10/306,732, filed on Nov. 29, 2002 now U.S. Pat. No. 7,010,741, which claimed the benefit of U.S. Provisional Patent Application, Ser. No. 60/421,798, filed on Oct. 29, 2002 with the same title and by the same inventors. The entire contents of the applications are incorporated herein by reference.

The present invention relates generally to error detection and correction in semiconductor memories, and more specifically to error detection and correction in Content Addressable Memories ("CAMs").

BACKGROUND OF THE INVENTION

Conventional content addressable memory (CAM) has been implemented primarily using static random access memory (SRAM) cells. SRAM-based CAMs have received widespread use due to the high access speed of SRAM memory cells and the static nature of the cells. Furthermore, SRAM cells can be manufactured using a pure-logic type fabrication process, which is commonly used for non-memory circuit blocks.

In addition to random access memory (RAM) functions, such as writing and reading data, CAMs are also capable of performing searches. Generally, stored data is retrieved and compared with target data for determining if the stored and target data match. If the stored and target data do match, a match result is indicated, otherwise a mismatch result is indicated. Thus, CAMs are particularly useful for fully associative memories such as look-up tables and memory-management units.

Many current applications utilize ternary CAMs, which are capable of storing three logic states. For example, the three logic states are logic '0', logic '1' and 'don't care'. Therefore, such CAM cells require two memory cells to store the logic states, as well as a comparison circuit for comparing stored data with search data provided to the CAM.

However, various problems exist with semiconductor memories and, thus, affect CAMs as well. One such type of error, referred to as "soft errors", are a well-known problem. The major cause of soft errors is alpha particle radiation, which can generate numerous electron hole pairs when it strikes a transistor diffusion area. These electron hole pairs can flip the state of data stored in a semiconductor memory cell. Clearly this is an undesirable occurrence. It is often important to detect that such an error has occurred and correct it if possible.

Error detection and correction has been attempted previously by using Hamming codes. Hamming codes typically require 5 extra bits per 32 bits or 7 extra bits per 64 bits, resulting in a data storage overhead of 15.6% or 10.9% respectively. Hamming codes in CAMs typically require 8 extra bits per 72 bits, for a data storage overhead of 11.1%. Evaluating the Hamming code also requires additional logic cycles and, thus, it can be time consuming to detect an error.

Alternately, it is possible to use parity bits. Generally, a parity bit is a bit that is appended to a word for representing the number of bits in the word that have a value '1'. In an example of odd parity, if the number of bits that are a '1' is even, then the parity bit is '1'. If the number of bits that are '1' is odd, then the parity bit is '0'. The concept of parity bits in general is well known in the art and need not be described in greater detail.

The concept of using horizontal and vertical parity in a semiconductor memory is described in U.S. Pat. Nos. 4,456,980 and 4,747,080 issued to Yamada et al. Generally, however, the method described by Yamada requires complex circuitry and many wide buses to implement. However the requirement for many wide buses renders this idea impractical as the area consumed to route so many signals makes the design cost prohibitive to manufacture.

In addition, reference may be made to the following patents and publications. U.S. Pat. No. 6,353,910 (Carnevale) discloses the storing ECC data within the array and exemplifies the complexity of non-parity based systems. U.S. Pat. No. 5,127,014 (Raynham) discloses the addition of ECC to a DRAM memory and the scrubbing of errors during a refresh cycle. The ECC data adds significant overhead. U.S. Pat. Nos. 4,456,980 and 4,747,080 (see above) introduce the XY parity concept in a semiconductor memory. However they require significant wide bussing and are not practical. U.S. Pat. No. 4,183,463 (Kemmetmueller) discloses a two-dimensional parity scheme. U.S. Pat. No. 6,125,466 (Close) discloses two-dimensional parity in a subset of the array. U.S. Pat. No. 5,134,616 (Barth) discloses a memory with hamming codes at the end of the wordline. It adds redundancy. U.S. Pat. Nos. 4,688,219 and 4,768,193 (Takemae) disclose another two-dimensional parity scheme with very complex bussing. Finally, in a paper by Pinaki Mazumder (Pinaki Mazumder, "An On-Chip ECC Circuit for Correcting Soft Errors in DRAM's with Trench Capacitors", IEEE JSSC, Vol. 27, No. 11, November 1992), a horizontal, vertical and diagonal parity scheme is disclosed with all the parity bits stored on the same word line. However, this paper does not disclose true horizontal and vertical parity in space, as all parity bits are stored on the same wordline.

A need, therefore, exists for an improved circuit and method for error detection and correction in CAMs. Consequently, it is an object of the present invention to obviate or mitigate at least some of the above mentioned disadvantages.

SUMMARY OF THE INVENTION

In accordance with an aspect of the present embodiment there is provided a circuit for detecting and correcting errors in an array of content addressable memory (CAM) cells. The CAM array includes wordlines, searchlines, bitlines, and matchlines for reading from, writing to, and searching CAM cells in said array. The circuit comprises the following.

At least one row parity CAM cell per row of the array stores a value representing a parity of a predefined portion of an associated row. At least one column parity CAM cell per column of the array stores a value representing a parity of a predefined portion of an associated column. A control circuit reads, writes, and searches data stored in said array. A parity check circuit compares a calculated parity of the predefined portion of data read from a row of the array with data from the associated row parity CAM cell. If the calculated parity and the stored parity data do not match, the parity check circuit compares a calculated parity of each column with data from associated column parity CAM cells, until a mismatch is determined, thereby identifying the error. The parity circuit inverts data stored at an intersection of the row and column mismatches.

In accordance with another aspect of the invention, there is provided a method for detecting and correcting errors in an array of content addressable memory (CAM) cells. The array includes wordlines, searchlines, bitlines, and matchlines for reading from, writing to, and searching CAM cells in the array. The method comprises the following steps.

A row parity bit corresponding to a parity of a first plurality of bits stored along a row of CAM cells is stored. A column parity bit corresponding to the parity of a second plurality of bits stored along a column of CAM cells is stored. A parity of the first plurality of bits is read and generated and the generated parity is compared to the stored row parity bit. If the generated and stored parity bits do not match, columns of the array are cycled through. A parity of the second plurality of bits is read and generated and the generated parity is compared to the stored column parity bit until a mismatch is indicated. A bit located at an intersection of the mismatched row and column is inverted if the mismatch is indicated.

In accordance with yet another aspect of the invention, there is provided a circuit for writing data to a content addressable memory (CAM) cell in an array of CAM cells. The array includes a parity row and a parity column for error correction and wordlines, bitlines, searchlines, and matchlines for reading from, writing to, and searching CAM cells in the array. The circuit comprising the following.

A read sense amplifier receives previously stored data from the bitlines. A read latch latches the previously stored data. A read driver drives the previously stored data onto a databus. A write latch latches new data to be written from the databus. A write driver drives the new data to the bitlines. If the data read from the previously stored data is different from the new data, a corresponding column parity bit in the parity row is inverted.

BRIEF DESCRIPTION OF THE DRAWINGS

Embodiments of the invention will now be described by way of example only, with reference to the following drawings in which.

DETAILED DESCRIPTION OF THE PREFERRED EMBODIMENTS

Figure 1:
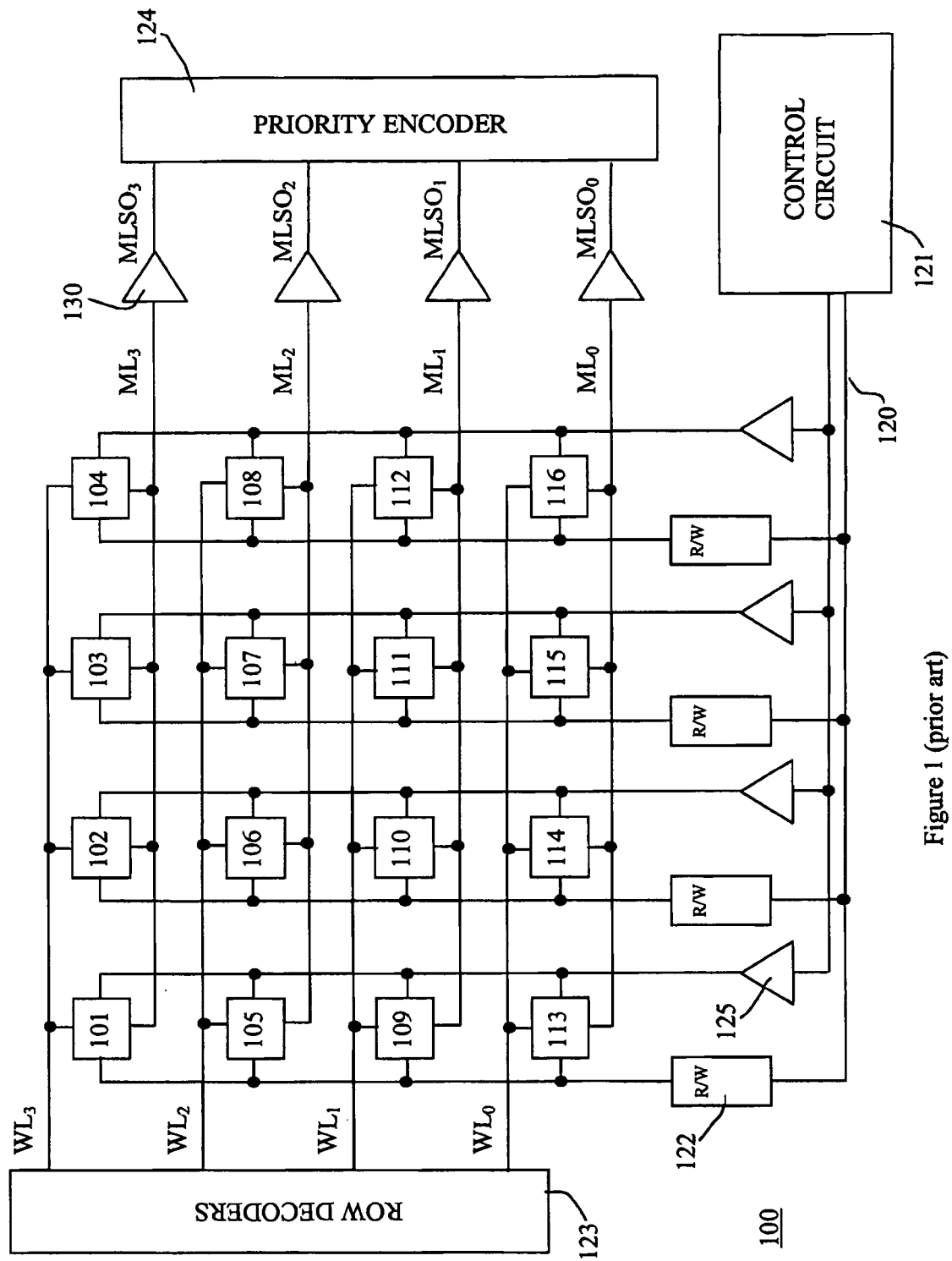
FIG. 1 is schematic diagram illustrating a typical CAM array in accordance with the prior art.

For convenience, like numerals in the description refer to like structures in the drawings. A CAM is organized into blocks of rows and columns of CAM memory bits. For each row there is an extra parity bit which results in an extra column of memory cells. For each column there is also an extra parity bit which results in an extra row of memory cells. In a CAM the word length is usually the length of the row.

When a data word is written into a row, the parity of all the bits in that row is calculated and stored in the parity bit for that row. For each column in the row, the written bit is compared to the previously stored bit for that row. If the bits are different the column parity bit is inverted. If they are the same the column parity bit is left alone.

When data is read from a row, the parity check circuitry compares the parity of the stored bits to that of the stored parity bit. If they are the same the data is output normally. If they are different, it indicates that a bit along that row is in error. To determine which bit is in error, the invention makes use of the search features of a CAM. Each column may be searched individually by searching for a 1 on each column while masking all other columns. The match results will represent the data in that column. The parity of the match results is compared to the column parity bit. If the parity does not match, then the column in which the parity error has occurred has been found. If the parities match then the current column does not contain the error and the search proceeds to the next column. Data is stored in a binary format, that is it is either a 1 (high) or a 0(low), and therefore if the data is wrong the correct value is the inverse. To correct the error the state of the bit at the selected row and identified column is inverted, thereby detecting and correcting the error.

Figure 2:
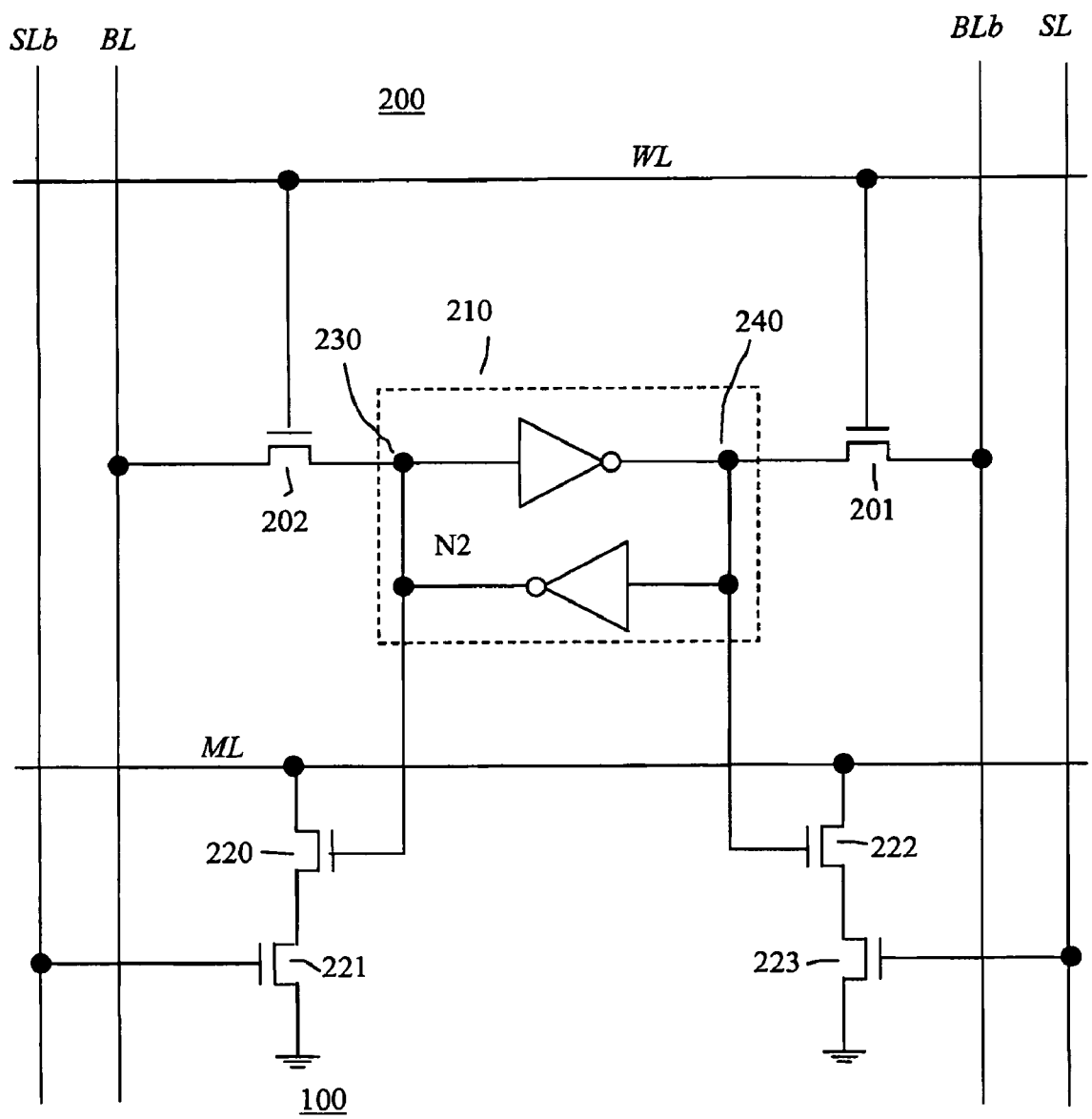
FIG. 2 is a schematic diagram illustrating a typical SRAM based CAM cell in accordance with the prior art.

Referring, to FIG. 2 a schematic diagram illustrating a typical CAM cell in accordance with the prior art is illustrated generally by numeral 200. The CAM cell comprises first and second access transistors 202 and 201, a pair of cross-coupled inverters 210, and first, second, third, and fourth comparator transistors 220, 221, 222, and 223. Control lines for the CAM cell 200 include a bitline pair BL and BLb, a searchline pair SL and SLb, a wordline WL, and a matchline ML. The access transistors 202 and 201 are gated by the wordline WL. The first access transistor 202 is coupled between a first line BL of the bitline pair and the cross-coupled inverters 210 at a first node 230. The second access transistor 201 is coupled between a second line BLb of the bitline pair and the cross-coupled inverters 210 at a second node 240.

The first and second comparator transistors 220 and 221 are serially coupled between the matchline ML and ground, respectively. The first comparator transistor 220 is gated by the first node 230 and the second comparator transistor 221 is gated by the first line SLb of the searchline pair.

The third and fourth comparator transistors 222 and 223 are serially coupled between the matchline ML and ground, respectively. The third comparator transistor 222 is gated by the second node 240 and the fourth comparator transistor 223 is gated by the second line SL of the searchline pair.

The operation of the CAM cell 200 is described as follows. To store data in the cell, the wordline WL is driven high, which turns on access transistors 202 and 201. The desired complementary data is driven onto the bitlines BL and BLb. The data is passed through the access transistors to the cross-coupled inverters 210, which function as a storage latch. The wordline WL is then driven low, which turns off the access transistors 202 and 201 and the storage latch 210 maintains the data. Reading data from the cell is similar to storing data, except that the data is transferred from the storage latch 210 to the bitlines BL and BLb.

To search the contents of the cell, search data is placed on the searchline pair SL and SLb and the matchline ML is precharged high. If, for example, the cell has stored a '1', node 230 is driven high by inverter 211 and node 240 is driven low by inverter 210. This results in transistor 220 being turned on and transistor 222 being turned off.

If a search is performed for a '0', SL is driven low and SLb is driven high. This results in transistor 221 being turned on and transistor 223 being turned off. Since both transistors 220 and 221 are on, a conduction path from the matchline ML to ground exists and the matchline ML is discharged to ground. Discharging of the matchline ML indicates a miss. There are typically many CAM cells per matchline ML and it only takes a miss on one of them to pull down the matchline ML.

If a search is performed for a '1', SL is driven high and SLb is driven low. This results in transistor 221 being turned off and transistor 223 being turned on. No conduction path from the matchline ML to ground exists and, thus, the matchline ML remains high. A charged matchline ML indicates that a match has occurred.

Further, a cell may be masked out of a search by driving both SL and SLb low. This ensures that no conduction path exists between the matchline ML and ground within that cell. Thus, the contents of the cell are ignored or masked out of the search.

Referring to FIG. 1 schematic diagram illustrating a typical CAM array in accordance with the prior art is illustrated generally by numeral 100. The array 100 comprises sixteen CAM cells 101 to 116 arranged in a four-by-four grid. CAM cells in the same row share wordlines WL and matchlines ML. CAM cells in the same column share bitline pairs BL and BLb and searchlines pairs SL and SLb. The array 100 further includes an internal databus 120, control circuitry 121, read/write (R/W) circuits 122, row decoders 123, matchline sense amplifiers 130, a priority encoder 124, and data amplifiers 125.

The databus 120 couples the control circuitry with the bitline BL and searchline SL pairs. The bitline pairs BL are coupled to the databus via respective read/write circuits 122. The searchline pairs SL are coupled to the databus via respective data amplifiers 125. The wordlines are coupled to the row decoders 123. The matchlines ML are coupled to the priority encoder 124 via respective matchline sense amplifiers 130.

The operation of the circuit is described as follows. Data is loaded into the array 100 by the control circuitry 121 and the row decoders 123. The row decoders 123 select one of the wordlines WL and drive it high. The control circuitry 121 places the write data on the internal databus 120. Each read/write circuit 122 takes an appropriate data bit from the internal databus 120 and drives the associated bitlines BL and BLb with the corresponding complementary data. The read/write circuit 122 is strong enough to override data already stored in the cells 101 to 116. The data passes from each of the bitlines BL and BLb to the cell selected by the active wordline WL. The row decoders 123 then drive the selected wordline low and the data is stored in the cell. The control circuitry 121 releases the databus 120.

To read data from the array 100, the row decoders 123 select the appropriate wordline and drive it high. The data in the selected cells is driven out onto the bitlines BL. The read/write 122 circuits sense the data on the bitlines BL, amplify it, and drive it out onto the internal databus 120.

Searching the array is performed by first precharging the matchlines ML high and then putting search data on the searchlines SL and SLb. If a cell's content matches the search data then the cell does nothing. If a cell's content does not match the search data then the cell pulls the matchline ML low. It only takes one cell whose contents do not match the search data to pull down the matchline ML, thereby setting the matchline ML to a miss state.

The matchline sense amplifiers 130 sense the match results on the matchlines ML. The matchline sense amplifiers 130 have outputs $MLSO_0$ to $MLSO_3$ corresponding to each of the matchlines ML, which are fed to the priority encoder 124. The priority encoder 124 determines which matchline ML is the highest priority in the case of multiple matches.

Figure 3:
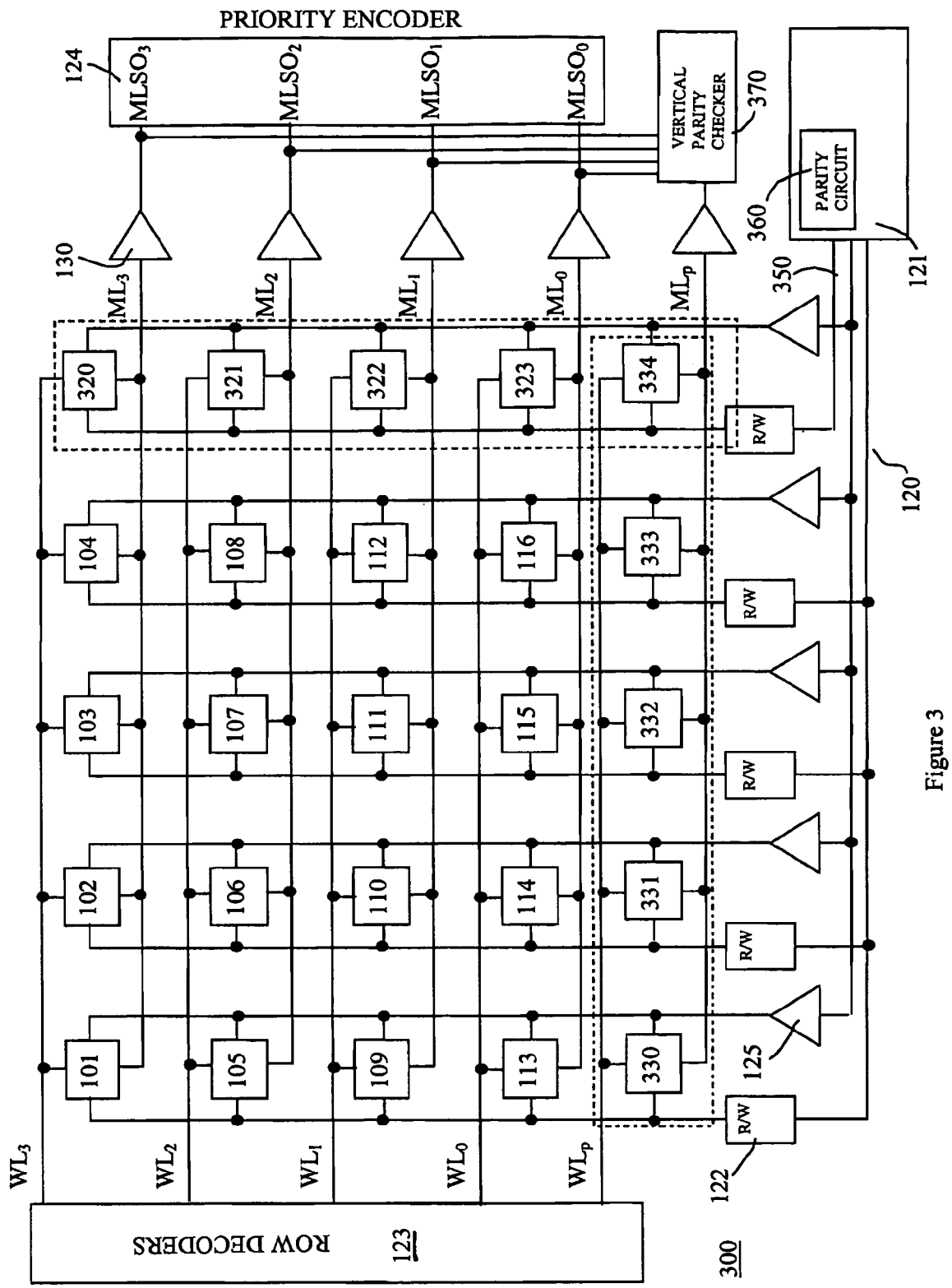
FIG. 3 is a schematic diagram illustrating a CAM array in accordance with an embodiment of the invention.

Referring to FIG. 3 a schematic diagram illustrating a CAM array in accordance with an embodiment of the invention is illustrated generally by numeral 300. The, array comprises the same CAM data cells 101 to 116 as in FIG. 1, but includes an addition parity column and an additional parity row. The parity column comprises a plurality of row parity bits 320 to 323. The parity row comprises a plurality of column parity bits 330 to 334. Row parity bit 320 stores the parity of the data stored in cells 101, 102, 103 and 104. Similarly row parity bits 321, 322, and 323 store the parity of the data stored in their respective rows. Column parity bit 330 stores the parity of the data stored in cells 101, 105, 109 and 113. Similarly column parity bits 331, 332 and 333 store the parity of the data stored in their respective columns. Column parity bit 334 stores the parity of the data stored in row parity bits 320, 321, 322 and 323. The cells used for storing the row and column parity bits are typically the same as those storing the data bits. Further, in addition to the databus 120, the array includes a parity bus 350 for the parity bits in each row. The parity bus 350 is coupled with the bitlines BL of the row parity bits 320 to 323. The parity bus is shown separately from the internal bus for illustrative purposes only, as will be appreciated by a person skilled in the art. The control circuitry 121 further includes parity circuitry 360 for performing parity calculations and comparisons. A vertical parity checker 370 is also provided for checking the parity of a column. The vertical parity checker 370 is coupled to the output of the matchline sense amplifiers $MLSO_0$ to $MLSO_3$ and $MLSO_p$. The vertical parity circuitry is shown as a separate block separated from the MLSO outputs. This circuit may also be distributed vertically in parallel with the priority encoder as will be understood by one skilled in the art.

The operation of the CAM array 300 is described as follows. To read data the row decoders select the appropriate wordline WL and drive it high. The data in the selected cells, including the parity cell is driven out onto the bitlines BL. The read/write circuits sense the data on the bitlines BL, amplify it and drive it out onto the internal databus 120. The parity data bit is driven to the parity bus 350. The control circuitry regenerates the parity of the stored data and compares it to the stored parity bit. If they match then the data is valid and the data is output. If they do not match then there is an error and the control circuitry initiates an error correction routine, as will be described in detail further on in the description.

The procedure for writing data into the array begins by reading the contents of a selected row. The data from the selected row is stored in the parity circuitry. The control circuitry places the write data on the internal databus 120. The parity circuitry also calculates the row parity of the write data and places it on the parity bus 350.

Each read/write circuit takes the appropriate data bit from the internal databus and drives the associated bitlines with the corresponding complementary data. The read/write circuit is strong enough to override the data stored in the cells. The data passes from the bitlines to the cell selected by the active wordline WL. The row decoders drive the selected wordline low again and the data is stored in the cell. The control circuitry releases the databus.

Further, the control circuitry compares the data written to the cells with the data read from the cells on a bit by bit basis. If the bits are the same then the column parity bit for a corresponding column does not need to change. If the bits are different then the column parity bit has to be inverted for that column. The parity circuitry flags the columns that need to be updated. A parity wordline WL associated with the parity row is activated, and the column parity bits 330 to 334 are read into the parity circuitry. The parity circuitry inverts the parity bits of the columns it has flagged and then writes the data back to the parity row, thus completing the write operation.

Note that this method requires that a known data value to be stored in the array so that it can be read. Therefore, the array is cleared and all bits set to a value, preferably '0', prior to writing data into the array. Optimally, this set up is performed as part of the power up sequence.

Searching the array is performed by first precharging the matchlines high and then putting the search data on the searchlines. The searchlines for the parity column are both set low. Masking the parity column prevents the row parity bits from affecting the search. As in the prior art, if a cell's content matches the search data then the cell does not affect the state of the matchline. If a cell's content does not match the search data then the cell pulls down the matchline to low. It only takes one cell whose contents do not match the search data to pull down the matchline and thereby set the matchline to a miss state.

As described during the read operation, if the parity bit for a row does not match the actual parity of the row, an error is detected. Once the error is detected by the control circuitry, an error correction routine is started. The routine causes the control circuitry to search the array one column at a time. One searchline pair is selected and all the other searchline pairs are masked. For example, if column j is selected then $SL_j$ is set to high and $SLb_j$ is set to low. All other search lines are set to low. If a cell in column j contains a high value then its corresponding matchline $ML_j$ remains high. If the cell in column j contains a low value then its corresponding matchline $ML_j$ is pulled low. Thus it can be seen that the matchlines represent the data stored in column j.

The matchline sense amplifiers sense the data and provide their output $MLSO_0$ to $MLSO_3$ to the vertical parity checker. The vertical parity check circuitry calculates the parity of the data on $MLSO_0$ to $MLSO_3$ and compares it to the column parity data read from $MLSO_p$. $MLSO_p$ represents the column parity bit for column j, and therefore it should represent the parity of the column. If the column parity bit matches the calculated parity for column j, then the error is not contained within column j and the control circuitry searches the next column. If the column parity bit does not match the calculated parity for column j, then there is an error in column j. The parity circuitry is then aware of both the row and column that is causing the error, and corrects it by reading out the appropriate row, inverting the erroneous bit and writing back the correct value.

The columns are scanned one by one until the last column is checked. If the error is in the last column then the error is in the parity bit and the error is corrected. If the last column is reached and no vertical parity error has been detected then a non-repairable error has occurred and the control circuitry flags the location of the error and outputs an error signal.

Figure 4:
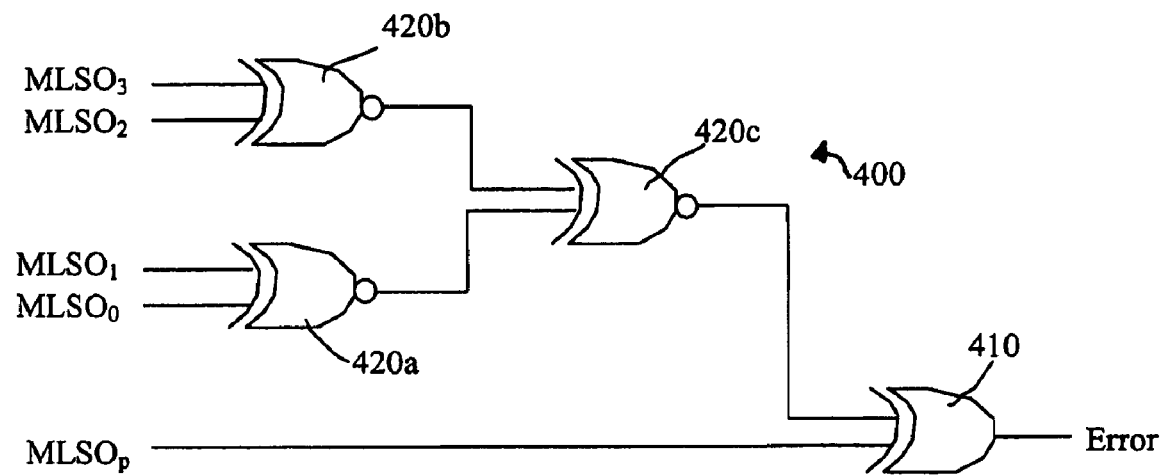
FIG. 4 is a schematic diagram illustrating of a vertical parity checker circuit in accordance with an embodiment of the invention.

Referring to FIG. 4 a schematic diagram illustrating a vertical parity checker circuit in accordance with an embodiment of the invention is illustrated generally by numeral 400. The vertical parity checker circuit 400 comprises a plurality of two-input exclusive NOR (XNOR) gates 420 and an exclusive OR (XOR) gate 410. The circuit 400 is arranged for odd parity. For even parity, the XNOR gates are replaced with XOR gates, as will be appreciated by a person skilled in the art.

In a first stage, each of the matchline sense amplifier outputs $MLSO_0$ to $MLSO_3$ is coupled to one input of two XNOR gates 420a and 420b. The outputs of the two XNOR gates 420a and 420b are input to a third XNOR gate 420c. The output of the third XNOR gate 420c is input to the XOR gate 410 along with the matchline sense amplifier output $MLSO_p$ of the column parity bit. The output of the XOR gate 410 is the output of the vertical parity checker.

The output of the third XNOR gate 420c represents the parity of inputs $MLSO_0$ to $MLSO_3$. This value is then XORed with the expected parity $MLSO_p$. Therefore, if the output of the vertical parity checker is low, the parity bits match and there is likely no error in the column. If the output of the vertical parity checker is high, the parity bits do not match and there is an error in the column. The error is corrected as described above.

Figure 5:
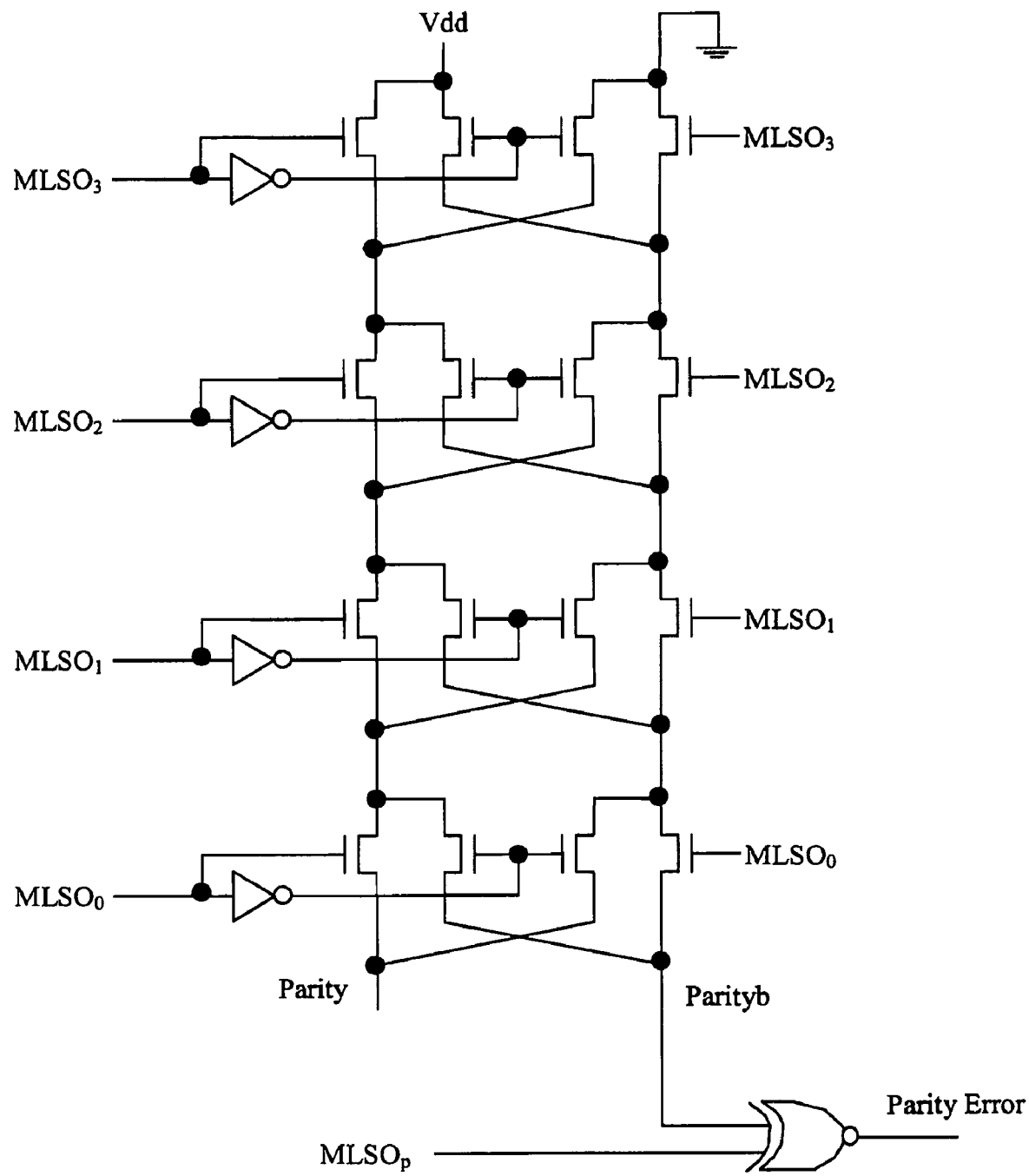
FIG. 5 is a schematic diagram illustrating a vertical parity checker circuit in accordance with an alternate embodiment of the invention.

Referring to FIG. 5 a schematic diagram illustrating a vertical parity checker circuit in accordance with an alternate embodiment of the invention is illustrated generally by numeral 500. It is built of dual pole charge over switch stages as will be appreciated by a person skilled in the art and is more suitable for integration in pitch limited circuitry. Again, the circuit 500 is set up for odd parity. For even parity, labels Parity and Parityb are reversed. Further, either the input to the XNOR is coupled to the new Parityb node or the XNOR gate is replaced with an XOR gate and its input is coupled to the new Parity node, as will be appreciated by a person skilled in the art.

Figure 6:
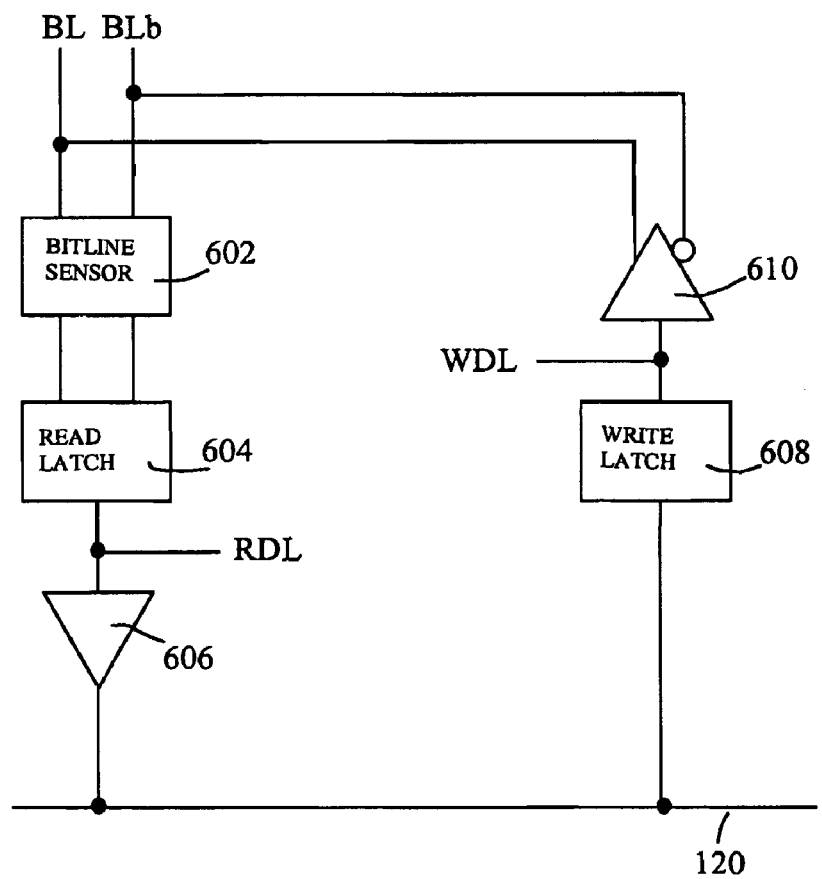
FIG. 6 is a block diagram illustrating a read/write circuit in accordance with an embodiment of the invention.

Referring to FIG. 6 a block diagram illustrating a read/write circuit in accordance with an embodiment of the invention is illustrated generally by numeral 600. The read/write circuit 600 comprises a bitline sense amplifier 602, a read latch 604, a read driver 606, a write latch 608, and a write driver 610. The bitlines BL and BLb are coupled to both the bitline sensor 602 and the write driver 610. When set to 'read', the bitline sensor 602 senses a charge on the bitlines BL and BLb, which represent a charge on a cell. Output from the bitline sensor 602 is provided to the read latch 604 for latching the sensed charge, which is output to the databus 120 via the read driver 606, at an appropriate time. When set to 'write', the write latch 608 latches the data from the databus 102 and drives the data out onto the bitlines BL and BLb via the write driver 608. The timing and control circuitry for read and write operations are well known in the art and need not be described in detail.

A typical CAM block has 128 rows of 72 bit words. Thus, this scheme requires and additional cell for each row (128), column (72), plus one cell for the added row and columns for a total of 201 extra bits per block. These numbers result in a data storage overhead of 2.19%. In an alternate embodiment where one parity bit is stored for every 36 bits of a word, the data storage overhead is 3.58%. In both cases, there is a significant savings over the prior art approaches.

In the present embodiment, when a new value is written to a row, each bit of the new value is compared with a corresponding bit of the old value. If the bit is different, then the corresponding column parity bit needs to be changed. In order to affect this change, the parity row is read out, the affected bits are changed, and the new value is written to the parity row. Since it is likely that at least one bit will change on a write operation, the time overhead for a write operation is generally increased by an additional read and write operation to correct the parity row. In an alternate embodiment, the system automatically updates bits in the parity row on a per column basis, depending on whether or not the new data in that column differs from the old data in that column.

Figure 7:
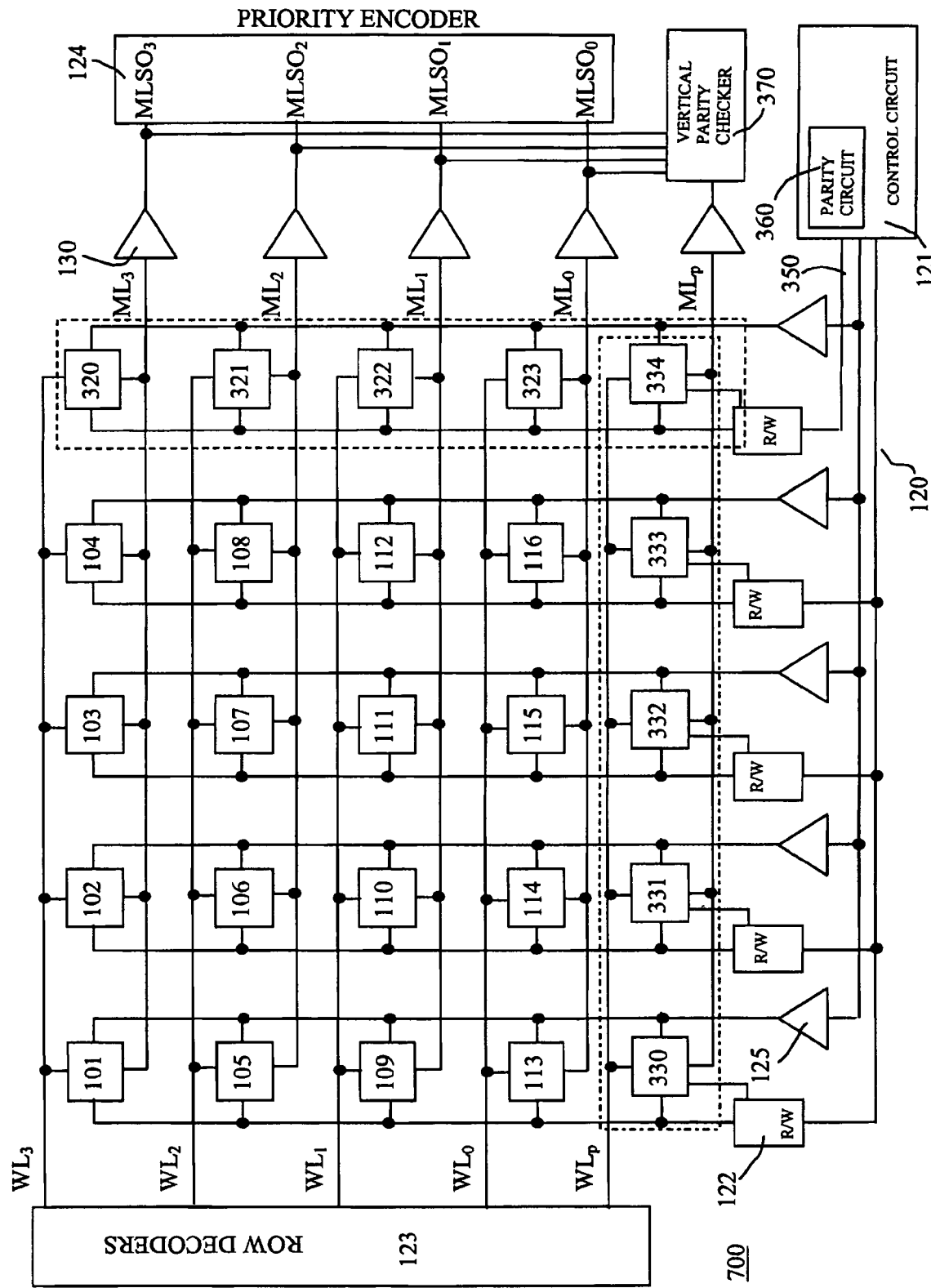
FIG. 7 is a schematic diagram illustrating a CAM array with parity cells in accordance with an alternate embodiment of the invention.

Referring once again to FIG. 6, the old data read from a column is stored in the read latch and is made available via a read signal RDL coupled to the output of the read latch. New data to be written to the column is stored in the write latch and is made available via a write signal WDL coupled to the output of the write latch. Referring to FIG. 7 a block diagram illustrating a CAM array in accordance with an alternate embodiment of the invention is illustrated generally by numeral 700. The CAM array 700 is similar to that described with reference to FIG. 3. However, the CAM array 700 in the present embodiment includes coupling the read/write circuit of each column with its associated column parity cell for communicating the read signal RDL and the write signal WDL. Further, the column parity cells do not have the same architecture as other cells in the array.

Figure 8:
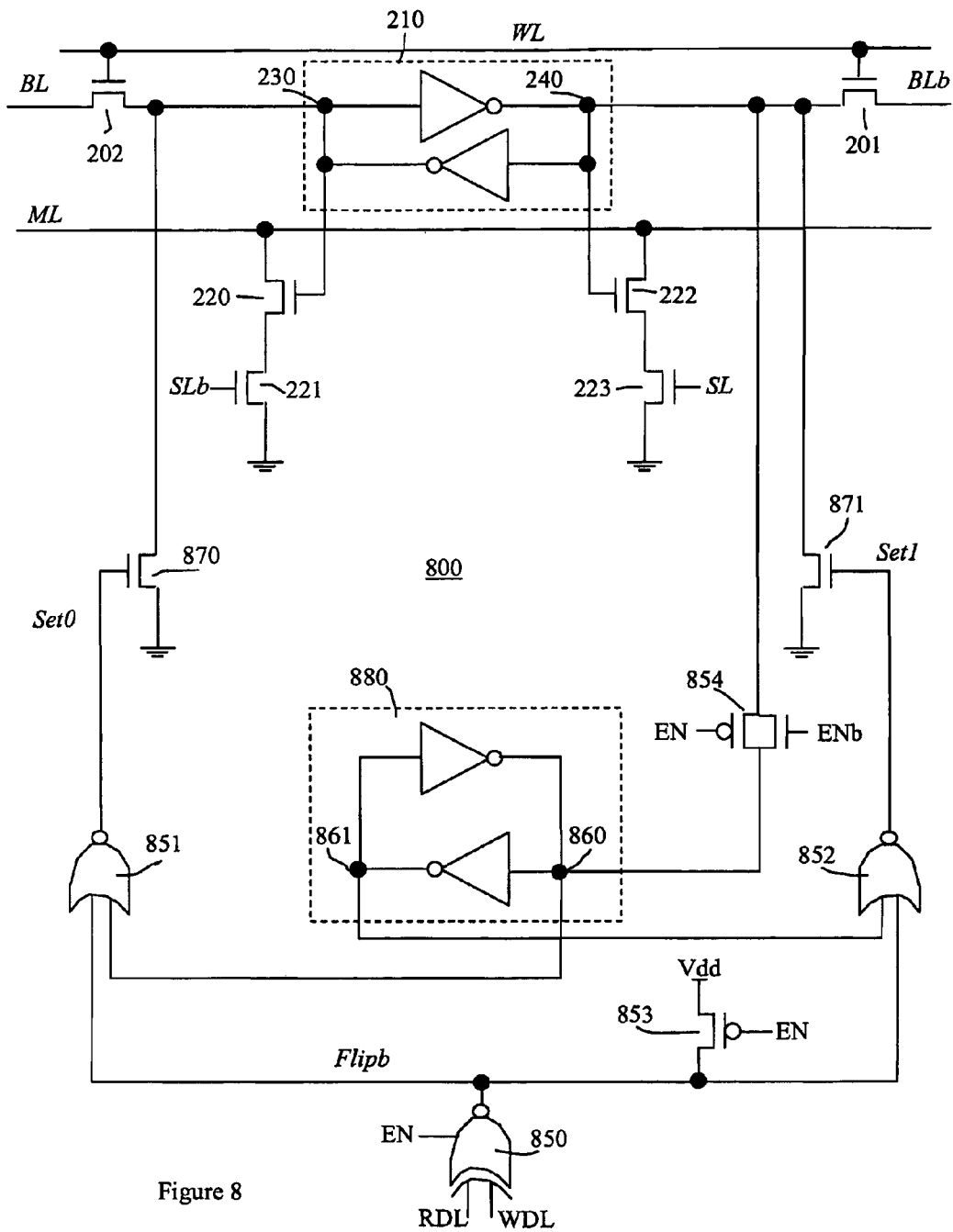
FIG. 8 is a schematic diagram illustrating a column parity cell for use with the CAM array of FIG. 7; and, FIG. 9 is a schematic diagram illustrating a ternary CAM cell in accordance the prior art.

Referring to FIG. 8 a schematic diagram illustrating the architecture of column parity cells in accordance with the present embodiment is illustrated generally by numeral 800. The architecture is similar to the other CAM cells as described with reference to FIG. 2, with the following additions. The column parity cells further include first and second switch transistors 870 and 871, first and second two-input NOR gates 851 and 852, an XNOR gate 850, a pull-up transistor 853, an additional cross-coupled inverter pair 880, and an enable gate 854. The additional components are generally controlled by enable signal EN and its complement ENb.

The first switch transistor 870 is coupled between the first node 230 and ground and is gated by the output Set0 of the first NOR gate 851. The second switch transistor 871 is coupled between the second node 240 and ground and is gated by the output Set1 of the second NOR gate 852. The second node 240 is coupled to a third node 860 via the enable gate 854. The enable gate 854 comprises an N-channel transistor and a P-channel transistor coupled in parallel. The N-channel transistor is gated by the inverse of an enable signal EN and the P-channel transistor is gated by the enable signal EN. The cross-coupled inverter pair 880 is coupled between the third node 860 and a fourth node 861. Therefore, the voltage levels at nodes 860 and 861 will always be complementary. Further, the third node 860 is coupled to one input of the first NOR gate 851. The fourth node 861 is coupled to one input of the second NOR gate 852. The other input to both NOR gates 851 and 852 is coupled to the output of XNOR gate 850, referred to as signal Flipb, and to a pull-up voltage via the pull-up transistor 853. The pull-up transistor is a P-channel transistor that is gated by the enable signal. Lastly, the XNOR gate 850 has the read and write signals RDL and WDL as its input, and is clocked by the enable signal EN.

The operation of the circuit is described as follows. In general, the additional components of the column parity cell are controlled by the enable signal EN. While the enable signal EN is low, the enable gate 854 is turned on, thereby charging node 860 to the same value as node 240. As a result of the cross-coupled inverter pair 880, the node 861 is charged to the complementary value of the node 860, which is the same as node 230. Further, the pull up transistor 853 is enabled, thus maintaining a high value on signal Flipb. Since signal Flipb is high, the outputs Set0 and Set1 of NOR gates 851 and 852 are low, thus turning off switch transistors 870 and 871. This prevents the additional circuitry from altering the value of the charge stored in the cell when the additional circuitry is disabled.

When writing data to the CAM the read procedure is executed as per the previous embodiment. However, the data read from the row is stored in the read latches of the read/write circuits. When the write data is loaded into the write latches, the enable signal EN is driven high. When the enable signal EN is high, pull-up transistor 853 is turned off and the pull-up voltage is disconnected. The XNOR gate 850 is enabled and compares the old data bit read from the column, stored in the read latch, with the new data bit for the column, stored in the write latch.

If the old data and the new data are the same it is desired that the column parity bit remain the same. The output Flipb of the XNOR gate 850 is high. Since Flipb is high signals Set0 and Set1 are low, as described above. As a result, both switch transistors 870 and 871 are turned off maintaining the same voltage levels at nodes 230 and 240. Therefore, the voltage level stored by the cell does not change, which is the desired result.

If the old data and the new data are different it is desired that the column parity bit change. The output Flipb of the XNOR gate 850 is low. In the present example, the charge stored in the cell causes the first node 240 to be high and second node 240 to be low. As previously described, this charge causes the third node 860 to be low and the fourth node 861 to be high. Since the fourth node 861 is coupled to the input of the second NOR gate 852, the output Set1 of the NOR gate 852 is low, thus turning off switch transistor 871. The third node 860 is coupled to the input of the first NOR gate 851. Since both inputs to the NOR gate 851 are low, the output Set0 is high, turning on switch transistor 870. As a result the first node 230 is pulled and the second node 240 is driven high through the cross-coupled inverter pair 210. Thus the state of the column parity bit is flipped, which is the desired result. The circuit works similarly if the first node 230 is low except that the output Set1 of the second NOR gate 852 is high.

Once the enable signal EN returns low, the transistor gate 854 is turned on, thereby charging node 860 to the same value as node 240. As a result of the cross-coupled inverter pair 880, the node 861 is charged to the complementary value of the node 860, which is the same as node 230. Further, the pull up transistor 853 is enabled, thus maintaining a high value on signal Flipb as desired. Thus it can be seen that the present embodiment does not require an additional read and write operation, as did the previous embodiment. Therefore, at the expense of some space for the additional circuitry, the present embodiment reduces the timing overhead associated with parity checking.

In yet another embodiment it is possible for there to be more than one row parity bit per row. For example, one parity bit could be assigned, for all even numbered locations and one parity bit could be assigned for all odd numbered locations. Alternatively, the row could be split physically with one parity bit covering a certain segment of contiguous bits while other parity bit covers other segments of contiguous bits.

In yet another embodiment of the invention the control circuitry can periodically scan through the array and read all the rows and fix any errors. This scanning can either occur during an idle time when the CAM is not being accessed or a certain percentage of the cycles can be set aside for error purging.

Figure 9:
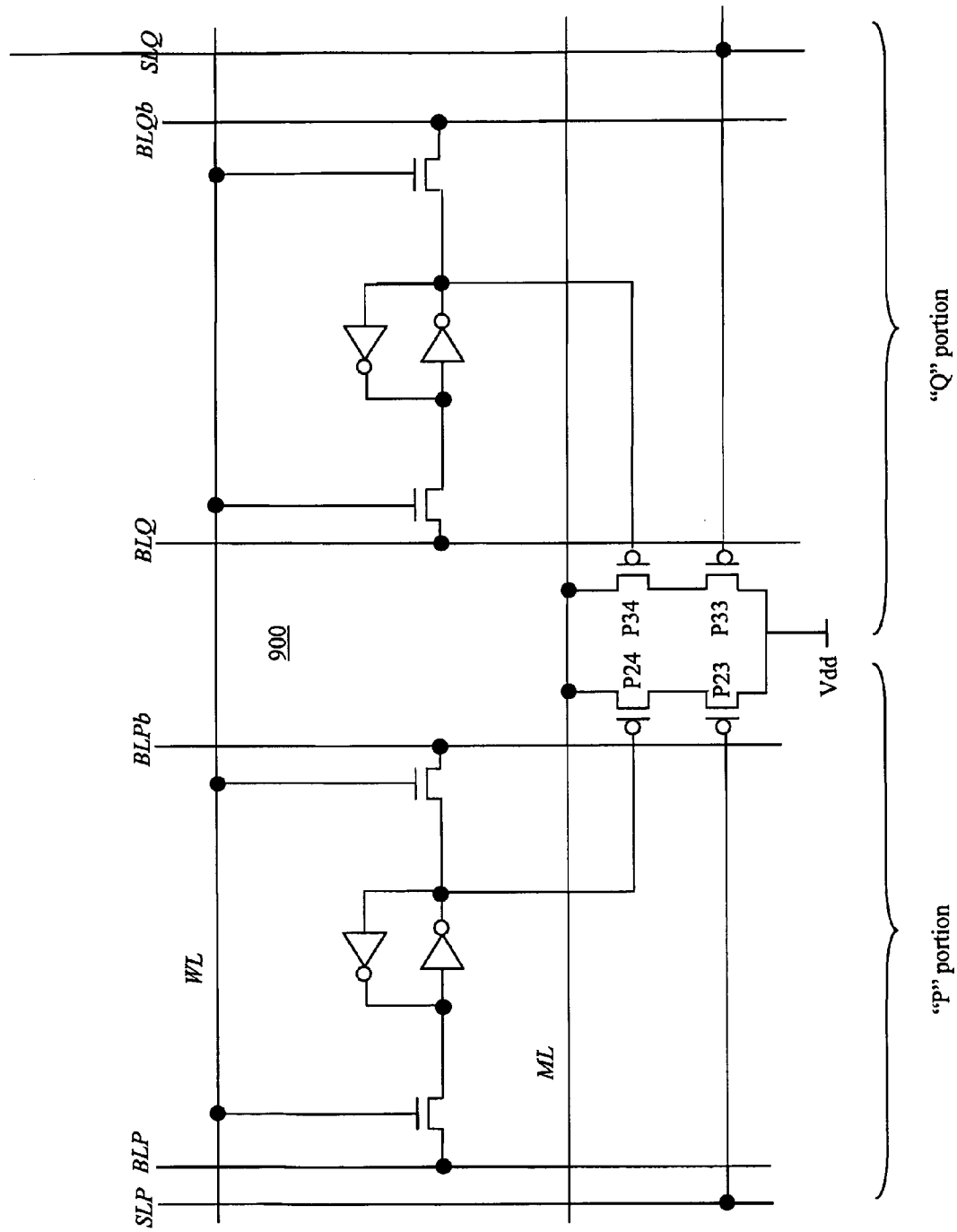

Further, the above description refers only to binary CAM cells. However, while binary CAM cells are used for exemplary purposes only, a person skilled in the art will appreciate that the invention can equally be applied to ternary CAM cells. Referring to FIG. 9, a schematic diagram of a ternary CAM cell in accordance with the prior art is illustrated. The ternary CAM cell is split into two half-cell P and Q. Each have has its own coresponding bitline and searchline pairs. Further, the ternary CAM cell has a matchline ML that is precharged low and pulled high if there is a miss. The ternary CAM cell stores three states 0,1 and don't care. A person skilled in the art will appreciate that the invention could be applied to ternary CAMs and assigned parity bit for each ternary CAM cell. Alternatively, it could further be applied to each half-cell of a ternary CAM cell where there is a 'P' parity bit for both rows and columns and a 'Q' parity bit for both rows and columns.

Yet further, the invention can be applied to alternate CAM cell architectures that are either known in the art or proprietary, as will be appreciated by a person skilled in the art.

Although the invention has been described with reference to certain, specific embodiments, various modifications thereof will be apparent to those skilled in the art without departing from the spirit and scope of the invention as outlined in the claims appended hereto.

The invention claimed is:

1. An error detection circuit for detecting errors in an array of content addressable memory (CAM) cells coupled to wordlines, searchlines, bitlines, and matchlines for reading from, writing to, and searching data in the CAM cells, the error detection circuit comprising:
   at least one row parity CAM cell per row of the array, said row parity CAM cell being coupled to the matchline of an associated row, the row parity CAM cell storing a value representing a parity of a predefined portion of an associated row;
   a row of column parity CAM cells, each column parity CAM cell being coupled to the bitline of an associated column and to a parity matchline, each column parity CAM cell storing a value representing a parity of a predefined portion of an associated column;
   a parity check circuit for comparing a calculated parity of the predefined portion of data read from a row of the array with data from the associated row parity CAM cell, a row mismatch being determined if the calculated parity mismatches the data from the associated row parity CAM cell;
   matchline sense amplifiers for providing matchline outputs corresponding to one of a match and a mismatch condition of the matchlines in a search and compare operation for data in one column of CAM cells of said array;
   a parity matchline sense amplifier for providing a parity matchline output corresponding to one of the match and the mismatch condition of the parity matchline in the search and compare operation for data in the one column of CAM cells of said array; and,
   a vertical parity checker for calculating a vertical parity of the matchline outputs and for comparing the vertical parity with the parity matchline output, a column mismatch being determined if the vertical parity mismatches the parity matchline output.

2. The error detection circuit of claim 1, wherein the parity check circuit comprises:
   an inverting circuit for inverting data stored at an intersection of the row having the row mismatch and the column having the column mismatches.

3. The error detection circuit of claim 1, wherein the vertical parity checker includes
   exclusive NOR logic for comparing the matchline outputs with each other for generating the vertical parity, and,
   exclusive OR logic for comparing the vertical parity with the parity matchline output and providing an error signal corresponding to the column mismatch when the vertical parity mismatches the parity matchline output.

4. The error detection circuit of claim 1, wherein the vertical parity checker includes serially connected dual pole charge over switch stages for driving a parity output to one of a high and low logic level corresponding to the vertical parity, each stage receiving one of the matchline outputs, and,
   a comparator for providing an error signal corresponding to the column mismatch when the parity output mismatches the parity matchline output.

5. A memory device comprising:
   an array of content addressable memory (CAM) cells coupled to wordlines, searchlines, bitlines, and matchlines for reading from, writing to, and searching data in the CAM cells;
   a parity store circuit including at least one row parity CAM cell per row of the array and at least one column parity CAM cell per column of the array,
   the row parity CAM cell being coupled to the matchline of an associated row, the row parity CAM cell storing a value representing a parity of a predefined portion of an associated row,
   the column parity CAM cell being coupled to the bitline of an associated column and to a parity matchline, the column parity CAM cell storing a value representing a parity of a predefined portion of an associated column; and
   a parity check circuit for comparing a calculated parity of the predefined portion of data read from a row of the array with data from the associated row parity CAM cell, a row mismatch being determined if the calculated parity mismatches the data from the associated row parity CAM cell;
   matchline sense amplifiers for providing matchline outputs corresponding to one of a match and a mismatch condition of the matchlines in a search and compare operation for data in the associated column;
   a parity matchline sense amplifier for providing a parity matchline output corresponding to one of the match and the mismatch condition of the parity matchline in the search and compare operation for data in the associated column; and,
   a vertical parity checker for comparing a calculated vertical parity of the matchline outputs with the parity matchline output, a column mismatch being determined if the vertical parity mismatches the parity matchline output.

6. The memory device of claim 5, wherein the parity check circuit comprises:
   an inverting circuit for inverting data stored at an intersection of the row having the row mismatch and the column having the column mismatch.

7. The memory device of claim 5, further comprising:
   an access circuit for accessing the CAM cells in the array.

8. The memory device of claim 7, wherein the access circuit comprises:

a read sense amplifier for receiving previously stored data from the bitlines;
a read latch for latching the previously stored data;
a read driver for driving the previously stored data onto a databus;
a write latch for latching new data to be written; and
a write driver for driving the new data to the bitlines.

9. The memory device of claim 7, wherein the access circuit further comprises:
a changing circuit for changing a corresponding column parity bit in the parity row if the data read from the previously stored data is different from the new data.

10. The memory device of claim 9, wherein the parity check circuit further comprises:
a data comparison circuit for comparing the previously stored data with the new data for a plurality of bits and the differences between the bits are flagged for changing corresponding column parity bits in the parity row.

11. The memory device of claim 10, wherein the parity check circuit further comprises:
a bit circuit for reading a plurality of bits from the parity row, for changing the flagged bits and for rewriting the plurality of bits to the parity row.

12. The memory device of claim 9, wherein the changing circuit comprises:
a parity bit change circuit for comparing data latched by the read latch with data latched by the write latch and inverting an associate column parity bit if the comparison results in a mismatch.

13. The memory device of claim 5, wherein the vertical parity checker includes
exclusive NOR logic for comparing the matchline outputs with each other for generating the vertical parity, and,
exclusive OR logic for comparing the vertical parity with the parity matchline output and providing an error signal corresponding to the column mismatch when the vertical parity mismatches the parity matchline output.

14. The memory device of claim 5, wherein the vertical panty checker includes serially connected dual pole charge over switch stages for driving a parity output to one of a high and low logic level corresponding to the vertical parity, each stage receiving one of the matchline outputs, and,
a comparator for providing an error signal corresponding to the column mismatch when the parity output mismatches the parity matchline output.

15. A method for detecting errors in an array of content addressable memory (CAM) cells coupled to wordlines, searchlines, bitlines, and matchlines for reading from, writing to, and searching data in the CAM cells, the method comprising:

reading and generating a parity of a plurality of bits stored along a row of CAM cells;
comparing the generated parity to a stored row parity bit associated with the plurality of bits;
iteratively executing a search and compare operation for data in each column of the row of CAM cells if the stored row parity bit mismatches the generated parity; and,
comparing a vertical parity of the matchline outputs corresponding to each row of CAM cells to a parity matchline output corresponding to a stored column parity bit associated with each column in each iteration, and identifying an error if the vertical parity mismatches the parity matchline output.

16. The method of claim 15, wherein the step of comparing the generated parity comprises:
comparing a calculated parity of a predefined portion of data read from a row of the array with data from the associated row parity CAM cell.

17. The method of claim 16, wherein the step of comparing a vertical parity comprises:
receiving the matchline outputs and generating the vertical parity corresponding to the matchline outputs.

18. The method of claim 17, wherein the step of generating the vertical parity includes exclusive NOR'ing the matchline outputs with each other.

19. The method of claim 18, wherein identifying the error includes exclusive OR'ing the vertical parity with the parity matchline output.

20. The method of claim 16, further comprising:
inverting data stored at an intersection of the row having the row mismatch and the column having the column mismatches.

21. The method of claim 15, wherein the step of iteratively executing a search and compare operation includes selecting a searchline pair corresponding to one column of the row of CAM cells and masking all other searchline pairs in each iteration.

22. The method of claim 21, wherein the step of selecting a searchline pair includes setting each searchline of the searchline pair to complementary logic levels, and the step of masking all other searchline pairs includes setting all the other searchline pairs to an inactive logic level.

* * * * *